United States Patent [19]

Shimazaki

[11] Patent Number: 4,634,497
[45] Date of Patent: Jan. 6, 1987

[54] METHOD AND APPARATUS FOR DECOMPOSING SEMICONDUCTOR THIN FILM

[75] Inventor: Ayako Shimazaki, Tokyo, Japan

[73] Assignee: Kabushiki Kaisha Toshiba, Kawasaki, Japan

[21] Appl. No.: 732,618

[22] Filed: May 10, 1985

[30] Foreign Application Priority Data

Jun. 22, 1984 [JP] Japan ................ 59-128754

[51] Int. Cl.⁴ .......................... B44C 1/22; C03C 15/00; C03C 25/06; H01L 21/306
[52] U.S. Cl. .................................... 156/646; 118/620; 118/728; 156/626; 156/657; 156/345; 219/121 LM; 427/53.1; 427/93
[58] Field of Search ................ 156/643, 646, 657, 662, 156/345, 626; 427/53.1, 93–95; 219/121 LM; 118/728, 620

[56] References Cited

U.S. PATENT DOCUMENTS 4,426,246  1/1984  Kravitz et al. .......................... 156/643
4,438,157  3/1984  Romano-Moran ...................... 427/93

FOREIGN PATENT DOCUMENTS 0019064  3/1980  European Pat. Off. .
2721086  12/1977  Fed. Rep. of Germany .
3013679  11/1980  Fed. Rep. of Germany .

OTHER PUBLICATIONS

Schafer et al., "Optically Enhanced Oxidation of Semiconductors," J. Vac. Sci. Technol., vol. 19, No. 3, pp. 494–497, Sep. Oct. 1981.
Ellis et al., "Phenomenological Model for Silicon Oxidation in Dry Oxygen in the Presence of HCL," J. Electrochem Soc., vol. 130, No. 9, pp. 1970–1974, Sep. 1983.
Weston et al., "HF Vapor Phase Etching (HF/VPE): Production Viability For Semiconductor Manufacturing and Reaction Model," J. Vac. Sci. Technol., vol. 17, No. 1, pp. 466–469, Jan/Feb 1980.
Sankaran et al., "Selective in Situ Vapor Etch and Growth of GaAs," J. Electrochem. Soc. Solid-State Science and Technology, vol. 126, No. 7, pp. 1241–1247, Jul. 1979.
Bondur et al., "Plasma Etching for SiO2 Profile Control," Solid State Technology, pp. 122–128, Apr. 1980.
Shimazaki et al., "Analysis of Ultratrace Impurities in the Silicon Device Manufacturing Process," Proceedings of the 26th Symposium on Semiconductors and Integrated Circuit Technology, p. 92, 1984.

Primary Examiner—William A. Powell
Attorney, Agent, or Firm—Finnegan, Henderson, Farabow, Garrett & Dunner

[57] ABSTRACT

In the present invention, a semiconductor thin film, i.e., a thin film formed on a semiconductor substrate such as a gate oxide film, is formed and decomposed within a single treating vessel. An apparatus of the present invention for decomposing a semiconductor thin film comprises a treating vessel housing a semiconductor substrate, section for introducing into the treating vessel mediums for forming a desired semiconductor thin film on the semiconductor substrate housed in the treating vessel, section for introducing into the treating vessel a medium for decomposing into liquid the thin film formed on the substrate, and section for recovering the decomposed liquid of the semiconductor thin film.

21 Claims, 2 Drawing Figures

METHOD AND APPARATUS FOR DECOMPOSING SEMICONDUCTOR THIN FILM

BACKGROUND OF THE INVENTION

The present invention relates to a method and apparatus for decomposing a semiconductor thin film, i.e., a thin film formed on a semiconductor substrate such as a gate oxide film and, particularly, to a method and apparatus which permit improved accuracy in the analysis of ultratrace impurities contained in a semiconductor thin film.

As known well, a semiconductor thin film such as an oxide film is formed first on a semiconductor substrate consisting of, for example, silicon in the manufacture of MOSIC or MOSLSI. Then, source and drain regions are formed in the substrate by impurity diffusion, followed by forming a gate oxide film on the gate region.

Since the gate oxide film has serious effects on the electric properties of the produced element, it is necessary to pay careful attention to the processes both before and after the gate oxide film formation. It should be noted in particular that even an ultratrace impurity contained in the gate oxide film such as Na, K or Fe markedly deteriorates, for example, the breakdown voltage of the element. It should also be noted that LSI devices tend to be made finer and finer recently in accordance with increase in the degree of integration, resulting in a serious demand for increased reliability in the breakdown characteristics of the gate oxide film. Naturally, it is a matter of serious concern in this field to decrease the impurity concentration, e.g., the metal impurity concentration, of the semiconductor thin film such as a gate oxide film as much as possible so as to improve the element characteristics. Also, in the supervision of the manufacturing process of MOS devices, it is of great importance to accurately analyze the ultratrace impurities contained in the semiconductor thin film.

It was customary in the past to employ a vapor phase decomposition method, which is a kind of etching technique, for analyzing the ultratrace impurities. Specifically, an oxide film is formed on a semiconductor wafer in a heating furnace or an oxide film-forming apparatus similar to that used in the ordinary manufacture of semiconductor devices. The wafer having an oxide film formed thereon is transferred into a hermetic vessel, and a hydrofluoric acid vapor of extremely high purity is applied to the oxide film of the wafer within the vessel so as to decompose the oxide film and recover a solution of the decomposed oxide film. The recovered solution is stirred and then weighed, followed by applying a known frameless atomic absorption analysis to the solution so as to carry out the quantitative and qualitative analyses of the ultratrace impurities contained in the oxide film. To be more specific, the recovered solution is poured into a graphite furnace with a micropipette and then electrically heated so as to dissociate the decomposed materials into the atomic state. Further, a resonant emission ray of the element to be measured is projected onto the resultant atomic vapor with a hollow cathode lamp, and the absorption intensity thereof is measured so as to determine the impurity concentration.

In the conventional analysis outlined above, it is possible to condense the decomposed solution of the oxide film, leading to a high sensitivity and a high accuracy of the analysis.

However, the conventional method described above is defective in that wafer contamination is caused in the step of forming the oxide film (semiconductor thin film) before the analytical step. Also, the wafer and the hermetic vessel tend to be contaminated in the step of transferring the oxide film-bearing wafer into the hermetic vessel. It follows that the recovered solution of the oxide film is caused to contain impurities providing secondary contaminants, resulting in failure to accurately analyze the ultratrace impurities contained in the oxide film (semiconductor thin film) itself.

To be more specific, the impurity analysis accuracy of the conventional method described above is as low as about ±20–30%, failing to fully utilize the high accuracy, e.g., ±1% for Na and ±2% for Fe, achieved by the frameless atomic absorption analytic apparatus. In other words, the conventional method described above fails to effectively control the impurity concentration of the gate oxide film in the manufacture of MOS devices, leading to a low reliability of the element characteristics.

The problems described above also remain unsolved in the analysis of the ultratrace impurities contained in the semiconductor thin film other than an oxide film, e.g., the ultratrace impurities contained in a nitride film.

SUMMARY OF THE INVENTION

An object of the present invention is to provide a new and improved method and apparatus for decomposing a semiconductor thin film. In the present invention, secondary contaminants are not contained in the decomposed material, making it possible to analyze the ultratrace impurities contained in the semiconductor thin film with a high accuracy. It is important to note that formation and decomposition of a semiconductor thin film can be achieved within a single vessel in the present invention.

According to one aspect of the present invention, there is provided a method of decomposing a semiconductor thin film, comprising:

a first step of forming a desired semiconductor thin film on a semiconductor substrate housed in a treating vessel; and a second step of decomposing into liquid the semiconductor thin film formed on the substrate within the treating vessel and subsequently recovering the decomposed liquid material.

According to another aspect of the invention, there is provided an apparatus for decomposing a semiconductor thin film, comprising:

a treating vessel housing a semiconductor substrate;

means for introducing into the treating vessel mediums for forming a desired semiconductor thin film on the semiconductor substrate housed in the treating vessel;

means for introducing into the treating vessel a medium for decomposing into liquid the thin film formed on the substrate; and means for recovering the decomposed liquid of the semiconductor thin film.

DETAILED DESCRIPTION OF THE PREFERRED EMBODIMENTS

Figure 1:
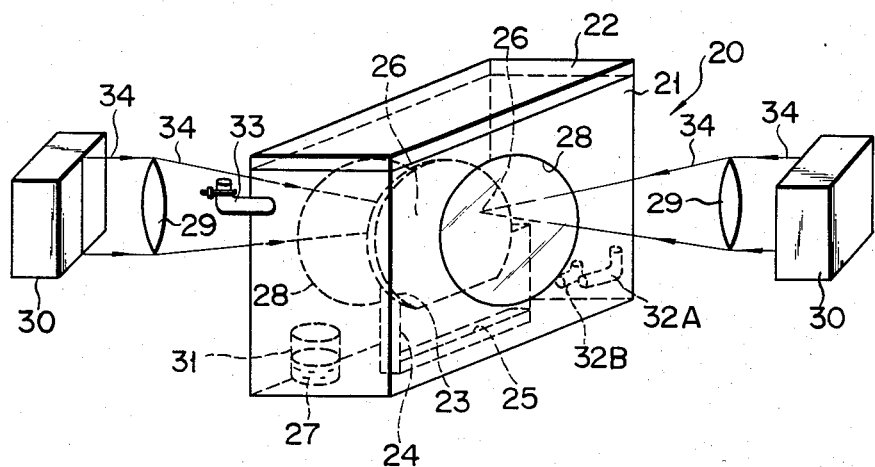
FIG. 1 schematically shows an apparatus according to one embodiment of the present invention.

Shown in FIG. 1 is an apparatus 40 of the present invention for decomposing a semiconductor thin film. It is seen that the apparatus 40 comprises a closed treating vessel 20 consisting of a box-shaped vessel body 21 formed of, for example, fluorine plastic and a lid 22 of the same material disposed to close the upper opening of the vessel body 21. A wafer holder 24 formed of, for example, fluorine plastic, is disposed in the central portion of the bottom of the vessel 20. A wafer 23, i.e., a semiconductor substrate formed of, for example, silicon, is held upright by the holder 24. A tray 25 for receiving the decomposed liquid of a semicoductor thin film is detachably mounted to the wafer holder 24 such that the tray 25, when attached to the holder 24, is positioned right under the wafer 23 held by the holder 24.

The central portions of mutually facing two side walls of the vessel 20 are formed of a transparent material so as to provide a pair of windows 28, 28. The transparent material mentioned should be insoluble in a dissolving liquid 27. For example, the windows 28, 28 are formed of sapphire.

As seen from the drawing, another side wall of the vessel 20 is provided with gas inlet ports 32A, 32B, with a gas outlet port 33 being provided in the other side wall facing said side wall provided with the gas inlet ports 32A, 32B. These inlet ports 32A, 32B are connected to oxygen gas and chlorine gas supply sources (not shown), respectively. Also, the gas outlet port 33 is connected to a gas processing apparatus (not shown). A pair of laser oscillators 30, 30 are provided a prescribed distance apart from the windows 28, 28 with a pair of converging lenses 29, 29 interposed therebetween. The laser oscillator 30 emits, for example, a rare gas eximer laser beam or a rare gas halide heteroeximer laser beam.

It should be noted that a dissolving liquid container 31 is inserted into the treating vessel 20 through, for example, a small door (not shown) formed in the side wall of the vessel 20. The container 31 is of, for example, a beaker shape, and contains the dissolving liquid 27 capable of evaporation at room temperature, e.g., hydrofluoric acid of very high purity.

In operating the apparatus 40, a high purity oxygen gas is introduced through the gas inlet port 32A into the treating vessel 20, with the gas outlet port 33 left open, so as to fill the vessel 20 with the high purity oxygen gas. A high purity chlorine gas may also be introduced, as desired, into the vessel 20 through the gas inlet port 32B so as to fill the vessel 20 with a mixture of high purity oxgen and chlorine gases. Then, the wafer 23 is mounted on the wafer holder 24. Under this condition, laser beams 34, 34 are emitted from the laser oscillators 30, 30 to reach the wafer 23 through the converging lenses 29, 29 and the windows 28, 28. It follows that both surfaces of the wafer 23 are selectively irradiated with the laser beams and, thus, semiconductor thin films 26, 26, i.e., oxide films, are selectively formed on both surfaces of the wafer 23.

The oxide films thus formed are decomposed by a vapor phase decomposition method, which is a kind of an etching technique. Specifically, the container 31 containing the dissolving liquid 27 is inserted into the treating vessel 20 to allow the vapor of the dissolving liquid 27 to act on and melt the oxide films 26, 26. The molten material flows downward along the surfaces of the wafer 23 so as to be received by the tray 25. The molten material thus recovered is subjected to the analysis of the ultratrace impurities contained in the semiconductor thin films 26, 26 using a frameless atomic absorption analyzer previously referred to.

In the embodiment described above, semiconductor thin films are formed and decomposed within the treating vessel 20 without transferring the wafer 23, making it possible to prevent the secondary contamination inherent in the prior art. As a result the analytical accuracy of the ultratrace impurities contained in the semiconductor thin films 26, 26 can be increased to as high as about $\pm 10\%$, in contrast to about $\pm 20-30\%$ for the prior art. It follows that it is possible to effectively control the impurity concentration of the gate oxide film in the manufacture of MOS devices, leading to an improved reliability of the element characteristics.

Figure 2:
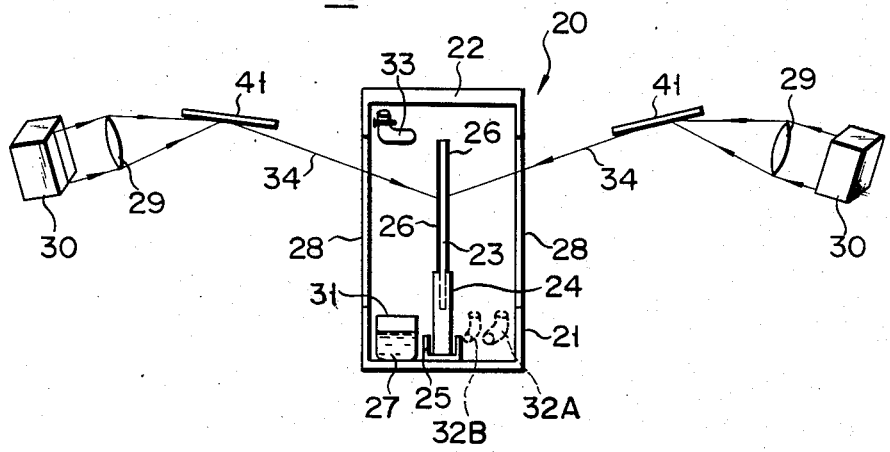
FIG. 2 schematically shows an apparatus according to another embodiment of the present invention.

FIG. 2 shows another embodiment of the present invention. The reference numerals common with FIGS. 1 and 2 denote the same members and, thus, description thereof is omitted. In the embodiment of FIG. 2, reflective plates 41, 41 are interposed between the converging lenses 29, 29 and the windows 28, 28. As seen from the drawing, the reflective plate 41 is inclined with respect to the laser beam 34. What should be noted is that the inclination of the reflective plate 41 can be suitably controlled by a proper mechanism (not shown). It follows that the entire region of the wafer surfaces can be irradiated with the laser beams 34, 34 by properly changing continuously the inclination of the reflective plates 41, 41 so as to form the semiconductor thin films 26, 26 to cover the entire region of the wafer surfaces. Naturally, the amount of the recovered molten material is increased in this case.

Where the treating vessel 20 is filled in advance with a mixture of oxygen and chlorine gases, the temperature at which the semiconductor thin film is formed on the substrate can be lowered. In addition, the time for forming the thin film can be shortened.

The present invention is not restricted to the embodiments described above. In other words, various modifications are included in the technical scope of the present invention. For example, ultraviolet rays can be used in place of laser beams in the step of forming semiconductor thin films, though it takes a somewhat longer time to form such thin films in the case of using ultraviolet rays. Also, it is possible to apply the technical idea of the present invention to the decomposition of nitride films, though it is necessary to somewhat modify the techniques for forming and decomposing the nitride films. To be brief, the steps of forming and decomposing semiconductor thin films such as oxide films and nitride films can be carried out within a single treating vessel in the present invention, making it possible to prevent the semiconductor thin films from secondary contamination.

What is claimed is:

1. A method of decomposing a semiconductor thin film, comprising:

a first step of filling a treating vessel with a prescribed gaseous atmosphere;

a second step of forming a desired semiconductor thin film on a semiconductor substrate housed in said treating vessel; and a third step of decomposing into liquid the semiconductor thin film formed on the substrate within said treating vessel and subsequently recovering the decomposed liquid material.

2. The method according to claim 1, wherein the semiconductor substrate consists of silicon.

3. The method according to claim 1, wherein the gaseous atmosphere consists of a mixture of oxygen, gas and chlorine gas.

4. The method according to claim 1, wherein the gaseous atmosphere consists of oxygen gas.

5. The method according to claim 1, wherein said second step includes irradiating the substrate with a laser beam to form an oxide film on the surface of the substrate.

6. The method according to claim 1, wherein said third step includes exposing said oxide film to high purity hydrofluoric acid vapor to decompose said oxide film.

7. The method according to claim 1, wherein said third step includes etching.

8. The method according to claim 7, wherein said etching is a vapor phase decomposition method.

9. An apparatus for decomposing a semiconductor thin film, comprising:
    a treating vessel for housing a semiconductor substrate;
    means for introducing into said treating vessel at least one medium for forming a semiconductor thin film on the semiconductor substrate housed in said treating vessel;
    means for introducing into said treating vessel a medium for decomposing into liquid the thin film formed on the substrate; and
    means for recovering the decomposed liquid of the semiconductor thin film.

10. The apparatus according to claim 9, wherein said treating vessel is adapted to house a semiconductor substrate comprised of silicon.

11. The apparatus according to claim 9, wherein said treating vessel includes a support member for holding upright the semiconductor substrate.

12. The apparatus according to claim 9, wherein said introducing means for forming a semiconductor thin film includes means for introducing at least one gas into said treating vessel.

13. The apparatus according to claim 9, wherein said introducing means for forming a semiconductor thin film includes means for introducing a radiated beam into said treating vessel.

14. The apparatus according to claim 13, wherein said radiated beam introducing means comprises a laser oscillator, a lens for converging the laser beam emitted from the laser oscillator, and a window formed in the side wall of the treating vessel for admitting the laser beam converged by said converging lens onto the semiconductor substrate held in said treating vessel, said window being formed of a light-transmitting material and being insoluble in the decomposing medium.

15. The apparatus according to claim 14, wherein said laser oscillator is operable to emit a rare gas eximer laser beam.

16. The apparatus according to claim 14, wherein said laser oscillator is operable to emit a rare gas halide heteroeximer laser beam.

17. The apparatus according to claim 14, wherein the material forming said window is comprised of sapphire.

18. The apparatus according to claim 13, wherein said radiated beam introducing means includes a scanning means for irradiating the beam over the entire surface region of a semiconductor substrate housed in said treating vessel.

19. The apparatus according to claim 9, wherein said means for introducing the decomposing medium comprises means for housing a dissolving liquid acting as a decomposing medium, and means for introducing said housing means into said treating vessel.

20. The apparatus according to claim 19, wherein the dissolving liquid is a high purity hydrofluoric acid.

21. The apparatus according to claim 9, wherein said means for recovering the decomposed liquid comprises a receptacle disposed under the semiconductor substrate housed within said treating vessel.

* * * * *